US012633358B2

(12) United States Patent (10) Patent No.: US 12,633,358 B2
Lee et al. (45) Date of Patent: May 19, 2026

(54) MEMORY DEVICE AND PROGRAMMING METHOD THEREOF

(71) Applicant: MACRONIX International Co., Ltd., Hsinchu (TW)

(72) Inventors: Ya-Jui Lee, Taichung City (TW); Kuan-Fu Chen, Taipei City (TW)

(73) Assignee: MACRONIX International Co., Ltd., Hsinchu (TW)

( * ) Notice: Subject to any disclaimer, the term of this patent is extended or adjusted under 35 U.S.C. 154(b) by 267 days.

(21) Appl. No.: 18/488,045

(22) Filed: Oct. 17, 2023

(65) Prior Publication Data

US 2025/0124991 A1 Apr. 17, 2025

(51) Int. Cl.
| *G11C 16/34* | (2006.01) |
| *G11C 11/56* | (2006.01) |
| *G11C 16/04* | (2006.01) |
| *G11C 16/08* | (2006.01) |
| *G11C 16/10* | (2006.01) |

(52) U.S. Cl.
CPC ...... *G11C 16/3459* (2013.01); *G11C 16/0433* (2013.01); *G11C 16/08* (2013.01); *G11C 16/102* (2013.01)

(58) Field of Classification Search
CPC . G11C 16/3459; G11C 16/0433; G11C 16/08; G11C 16/102; G11C 11/5628; G11C 16/0483; G11C 16/10; G11C 16/3427
See application file for complete search history.

(56) References Cited

U.S. PATENT DOCUMENTS

| 2016/0342494 A1* | 11/2016 | Yang | G06F 11/1072 |
| 2018/0166111 A1* | 6/2018 | Yu | G11C 7/225 |
| 2021/0193227 A1* | 6/2021 | Kim | G11C 29/52 |
| 2024/0177778 A1* | 5/2024 | Liu | G11C 16/0433 |

OTHER PUBLICATIONS

"Office Action of Taiwan Counterpart Application", issued on Aug. 13, 2024, p. 1-p. 5.

* cited by examiner

*Primary Examiner* — Han Yang
*Assistant Examiner* — Elizabeth Rose Agger
(74) *Attorney, Agent, or Firm* — J.C. PATENTS

(57) ABSTRACT

A memory device and a programming method thereof are provided. The memory device has multiple word lines and a dummy word line set. A word line is selected from the word lines and is applied with a program voltage, and unselected word lines and the dummy word line set are applied with a pass voltage. After programming the selected word line, a program verification is performed on the selected word line. When the selected word line passes the program verification, a high bound and/or low bound check for the threshold voltage distribution of at least one of the dummy word lines is performed. When at least one of the dummy word lines fails in the high bound and/or low bound check, the status of the selected word line is shown as fail or a flag is set thereto.

20 Claims, 9 Drawing Sheets

MEMORY DEVICE AND PROGRAMMING METHOD THEREOF

BACKGROUND

Technical Field

The disclosure relates to an operation method of a memory device, and more particularly, to a memory device and a programming method thereof.

Description of Related Art

Program disturbance is one of the challenges to overcome for NAND cell scaling. Junction leakage and channel boosting ratio (CBR) are considered to be the two major components that limit the program disturbance. Currently, many approaches have been discussed to improve the program disturbance. Source/drain junction engineering has been pursued to improve the junction leakage. However, the program disturbance, due to poor boosting, remains as one of the concerns for the NAND cell scaling.

A program disturbance window is also highly required in the development of three- dimensional (3D) NAND flash memory. A high reliability triple-level cell (TLC) or quad-level cell (QLC) needs a large memory cell open window between a high threshold voltage state and an erase state. Therefore, controlling the gradient channel potential by applying a program pass voltage (VPASSP on the dummy word line is important for preventing hot electron disturbance. However, the threshold voltage VT of the dummy word line may not always be distributed as expected. Program/erase cycling or process variation including a vertical channel size and a profile may also have impacts on the threshold voltage VT of the dummy word line. As a result, this would change the original gradient channel potential situation and break the optimized VPASSP setting.

FIG. 1 is a schematic diagram of voltage application during programming. When programming each word line of the memory cell array, the selected word line is applied with a program bias VPGM, and the unselected word lines are applied with a pass bias VPASSP. In addition, the memory cell array further includes bottom dummy word lines DWLB0~DWLB2, and during programming, the bottom dummy word lines DWLB0~DWLB2 are also applied with program pass biases VPASSP1~VPASSP3. As shown in FIG. 1, taking the bottom dummy word line DWLB1 as an example, if the threshold voltage is too low or too high, expected gradient channel potential I is affected and becomes the distributions like the curves II or III. This may cause disturbance during programming.

FIG. 2A is a graph showing the relationship between the threshold voltage of the dummy word line and the number of times of programming each word line, in which the horizontal axis represents the threshold voltage VT of the dummy word line DWLB0, and the vertical axis represents the number of times of programming. Each time a word line is programmed, a value of the threshold voltage VT is recorded. However, as may be seen from FIG. 2A, when programming from the top word line WL95 of the 3D NAND flash memory to the bottom word line WL0 in sequence, the threshold voltage VT of the dummy word line DWLB0 gradually increases with the increase in programming times.

FIG. 2B is a schematic diagram of the threshold voltage of the dummy word line being disturbed. As shown in FIG. 2B, the horizontal axis represents the number of the word line, sequentially from the word line WL95 to the word line WL0, and the vertical axis represents the threshold voltage VT (high bound, HB) of the dummy word line DWLB0. As may be seen from FIG. 2B, after the word line WL95 to the word line WL0 are programmed in sequence, the threshold voltage VT of the dummy word line DWLB0 is also disturbed from about 0.5V and rises to around 3V.

Therefore, there is a need to propose a programming method for 3D NAND flash memory to reduce the impact of the increase in threshold voltage VT of the dummy word line. Thus, the quality and reliability of memory devices such as 3D NAND may be improved.

SUMMARY

The disclosure provides a memory device and a programming method thereof, so as to further ensure the effectiveness and data retention of programming, and improve the reliability of programming.

According to an embodiment of the disclosure, a programming method for a memory device is provided. The memory device has a memory cell array. The memory cell array includes a plurality of word lines and a dummy word line set. The programming method includes the following steps. A word line is selected from the word lines, a program voltage is applied to the selected word line for programming, and a pass voltage is applied to word lines other than the selected word line in the word lines and the dummy word line set. A program verification is performed on the selected word line that has been programmed. In response to the selected word line passing the program verification, at least one of a high bound check and a low bound check is performed on a threshold voltage distribution of at least one dummy word line of the dummy word line set. In response to the at least one dummy word line of the dummy word line set failing in at least one of the high bound check and the low bound check, a status of the selected word line is shown as a program fail or an error flag is set.

According to another embodiment of the disclosure, a memory device is provided. The memory device includes a memory cell array and a controller. The memory cell array includes a plurality of word lines and a dummy word line set. The controller is configured to control the memory cell array. The controller performs programming on each of the word lines, which includes the following steps. A word line is selected from the word lines, a program voltage is applied to the selected word line for programming, and a pass voltage is applied to word lines other than the selected word line in the word lines and the dummy word line set. A program verification is performed on the selected word line that has been programmed. In response to the selected word line passing the program verification, at least one of a high bound check and a low bound check is performed on a threshold voltage distribution of at least one dummy word line of the dummy word line set. In response to the at least one dummy word line of the dummy word line set failing in at least one of the high bound check and the low bound check, a status of the selected word line is shown as a program fail or an error flag is set.

According to the embodiments of the disclosure, in the above-mentioned programming method and memory device, the high bound check further includes the following steps. A first threshold voltage of the at least one dummy word line of the dummy word line set is read. In response to the first threshold voltage being higher than a preset high bound value, whether a high bound failure bit count is greater than a first preset value is determined. In response to the high bound failure bit count greater than the first preset value, the status of the selected word line is shown as the program fail or the error flag is set.

According to the embodiments of the disclosure, in the above-mentioned programming method and memory device, the low bound check further includes the following steps. A second threshold voltage of at least one dummy word line of the dummy word line set is read. In response to the second threshold voltage being lower than a preset low bound value, whether a low bound failure bit count is greater than a second preset value is determined. In response to the low bound failure bit count being greater than the second preset value, the status of the selected word line is shown as the program fail or the error flag is set.

According to the embodiments of the disclosure, in the above-mentioned programming method and memory device, the first preset value may be the same as the second preset value.

According to the embodiments of the disclosure, in the above-mentioned programming method and memory device, the program fail may include marking the selected word line as a dummy word line, or marking a selected block as a bad block. According to the embodiments of the disclosure, in the above-mentioned programming method and memory device, the error flag may include setting a flag for the selected word line to revise operation settings.

According to the embodiments of the disclosure, in the above-mentioned programming method and memory device, the programming method or controller further performs: showing a status of programming pass and terminating the programming of the memory device in response to the at least one dummy word line of the dummy word line set being determined as passing at least one of the high bound check and the low bound check.

According to the embodiments of the disclosure, in the above-mentioned programming method and memory device, the memory device may be 3D NAND flash memory or 2D NAND flash memory. According to the embodiments of the disclosure, in the above-mentioned programming method and memory device, a memory cell of the memory cell array may be a single-level cell, a triple-level cell, a quad-level cell or a multi-level cell.

DESCRIPTION OF THE EMBODIMENTS

The embodiment of the disclosure provides a programming method for a memory device. Hereinafter, three-dimensional (3D) NAND flash memory is used as an example, but the disclosure is not limited thereto. The programming method may be adapted for any 3D structured memory. In addition, the disclosure may also be adapted for two-dimensional (2D) memory.

Figure 3:
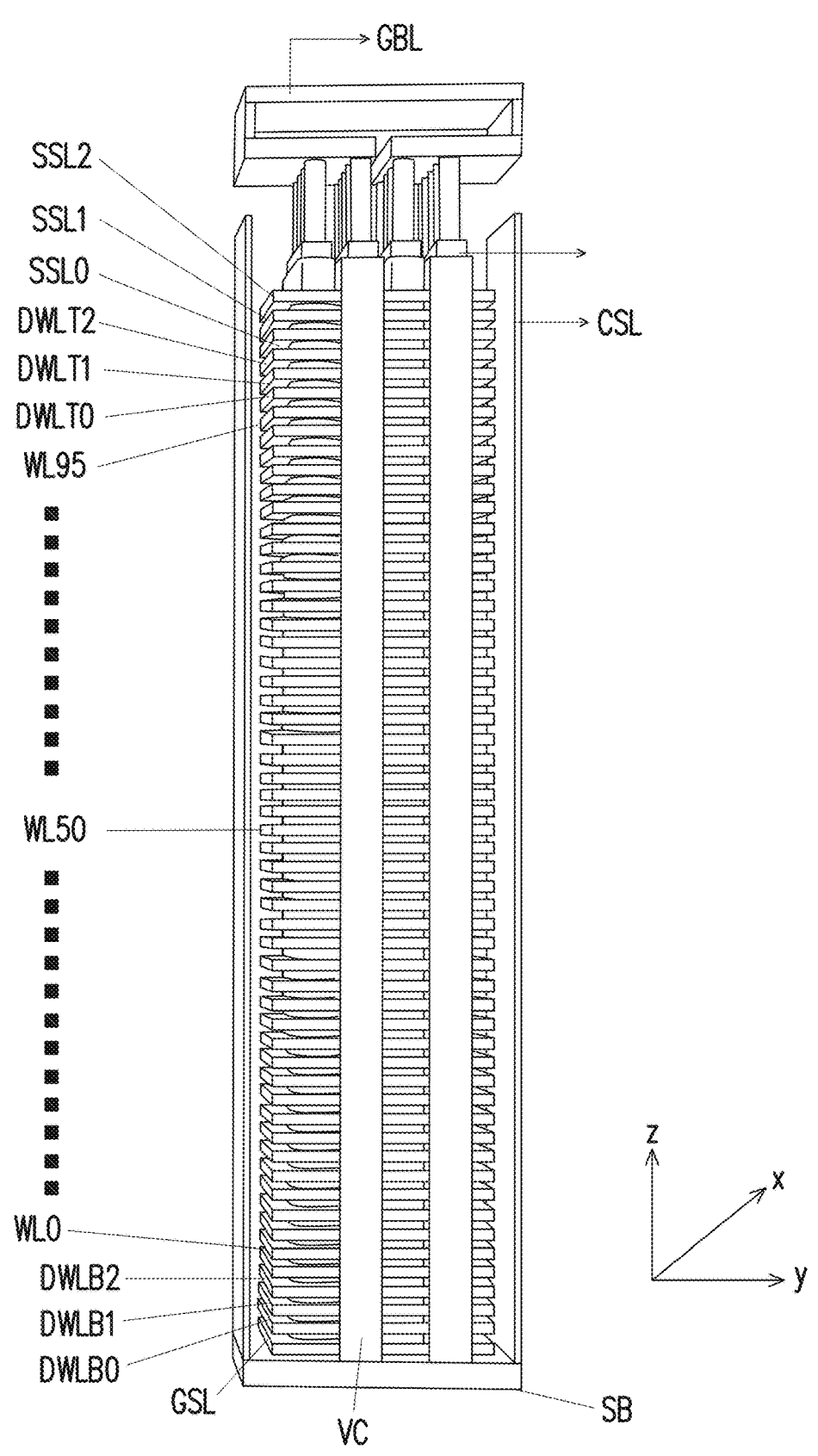
FIG. 3 is a schematic diagram of memory structures related to each word line.

FIG. 3 is a memory architecture of an application example of the disclosure, which shows a partial structure of 3D NAND flash memory. In the schematic structure of the 3D NAND flash memory as shown in FIG. 3, multiple word lines WL0~WL95 (taking 96 lines as an example) are formed in a vertical direction z, and a vertical channel VC is also formed along the vertical direction z. Each of the word lines extends in an xy plane. In addition, bottom dummy word lines DWLB2 to DWLB0 are further disposed below the word line WL0, and top dummy word lines DWLT2 to DWLT0 are also disposed above the word line WL95. Here, although three bottom dummy word lines and three top dummy word lines are shown as examples, the number of bottom dummy word lines and top dummy word lines is not particularly limited and may be appropriately adjusted according to requirements.

In addition, the 3D NAND flash memory may further include a common source line (CSL) disposed over a substrate SB. The substrate SB may be a silicon substrate. The common line (CSL) may be in a form of a conductive layer or a plurality of conductive lines disposed over the substrate SB. The CSL connects various source lines together. In this embodiment, the common source line CSL further extends in a normal direction z of the substrate SB. The 3D NAND flash memory may further include selection lines SSL0, SSL1, SSL2, etc., and the selection lines may be disposed above the top dummy word line DWLT2. A global source line (GSL) may further be formed below the bottom dummy word line in the 3D NAND flash memory, and a global bit line (GBL) may be formed above the top dummy word line to connect various bit lines. The 3D NAND flash memory structure shown in FIG. 3 is illustrated merely to facilitate understanding the relationship between the word lines (data word lines) WL0~WL95 and the dummy word lines, and is not intended to limit the implementation object of the disclosure.

Figure 4:
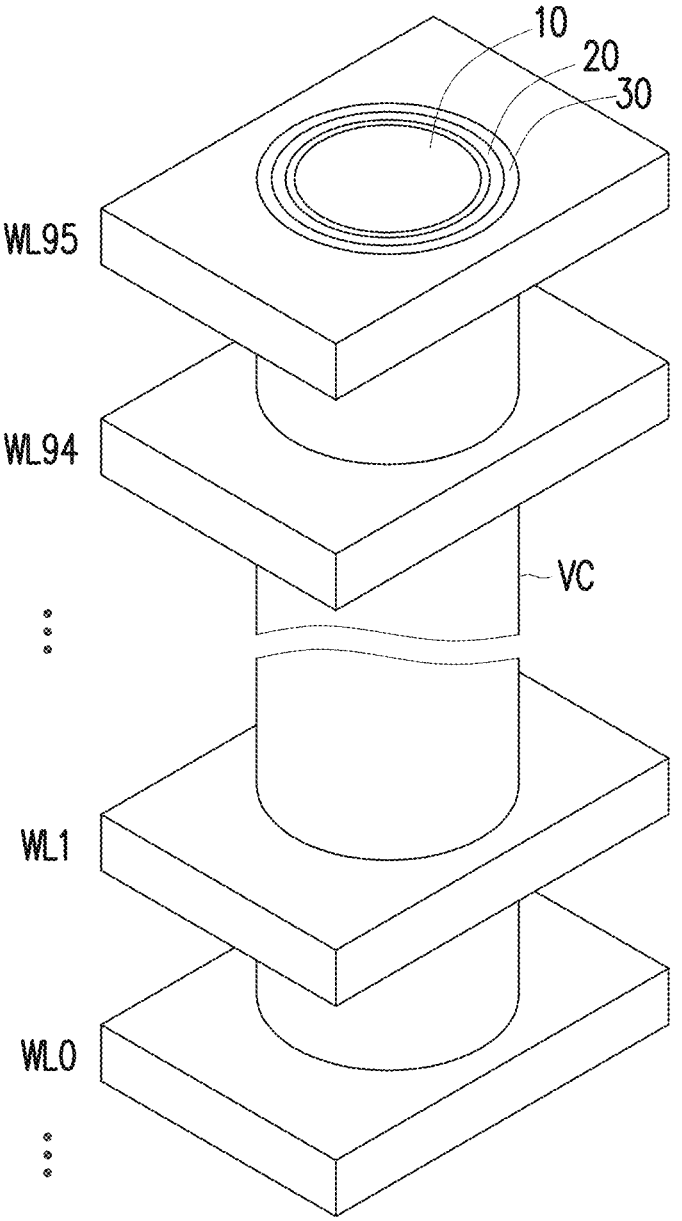
FIG. 4 is a schematic diagram of the structure of each word line.

FIG. 4 is a schematic diagram of the structure of each word line, which is an enlarged view of a part of the word lines in FIG. 3. As shown in FIG. 4, the 3D NAND flash memory includes the word lines WL0~WL95, and the word lines WL0~WL95 are penetrated by the vertical channel VC. The vertical channel VC has a dielectric layer core 10, a channel layer 20 surrounding the dielectric layer core 10, and a charge trapping layer 30 between each of the word lines WL0~WL95 and the channel layer 20. The channel layer 20 is, for example, formed by polycrystalline silicon. The charge trapping layer is composed of an oxide-nitride-oxide (ONO) layer. The structure illustrated here is merely an example of 3D NAND memory that may be adapted for the application of the programming method of the disclosure, and the method of the disclosure is not necessarily used for a certain memory structure.

Figure 5:
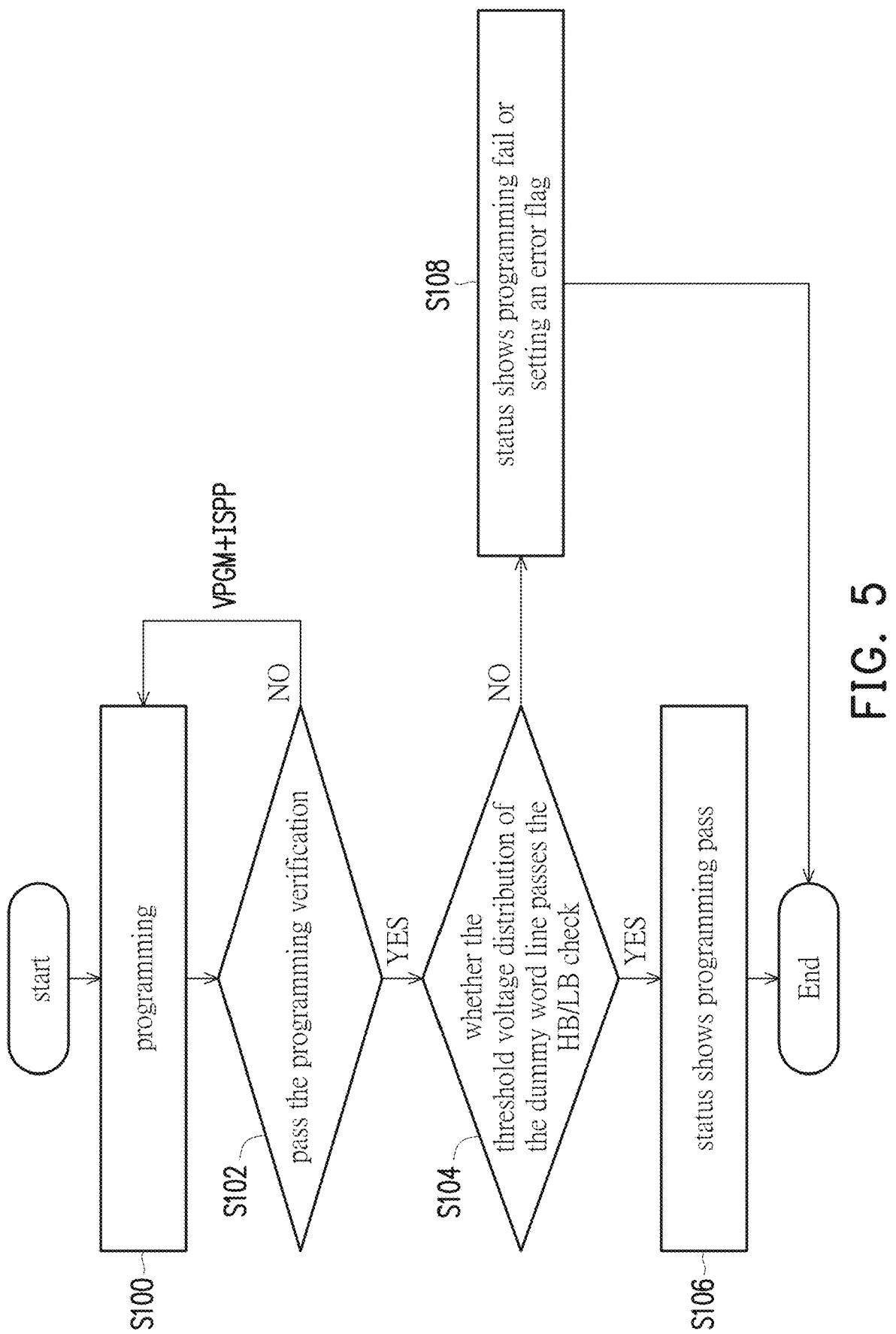
FIG. 5 is a schematic diagram of the process of memory programming according to one embodiment of the disclosure.

FIG. 5 is a schematic diagram of the programming process of a memory device according to an embodiment of the disclosure. The programming method of the memory device in the embodiment may be applied to the 3D NAND flash memory shown in FIG. 3. The memory device has a memory cell array. The memory cell array may include a plurality of word lines WL and a dummy word line set DWL. As an example, the dummy word line set DWL may include a plurality of bottom dummy word lines DWLB0~DWLB2 and top dummy word lines DWLT0~DWLT2 (refer to FIG. 3). In the following description, the programming method of the disclosure is described using the bottom dummy word lines DWLB0~DWLB2 as an example, and certainly the programming method of the disclosure may also be applied to the top dummy word lines DWLT0~DWLT2.

As shown in FIG. 5, in step S100, programming is performed on a word line in a memory cell array. For example, a word line is selected from the word lines in the memory cell array, i.e., a selected word line. Next, a program voltage (bias) VPGM is applied to the selected word line for programming. Here, programming the selected word line refers to programming all memory cells coupled to the selected word line. In addition, the word lines other than the selected word line among the plurality of word lines and the bottom dummy word lines DWLB0~DWLB2 (dummy word line set) are applied with a pass voltage VPASSP. Furthermore, during programming, a method, so-called increment step programming pulse (ISPP), may be used to program the selected word line.

In step S102, a program verification is performed on the programmed selected word line. The program verification may be carried out in any possible method, and is not specifically limited by the disclosure. The program verification may determine whether the memory cells on the selected word line have been correctly programmed. If the programmed selected word line fails to pass the program verification, it indicates that the selected word line has not been correctly programmed. In this way, the process returns to step S100, the selected word line is programmed again by increasing the programming voltage until the selected word line passes the program verification.

Figure 6:
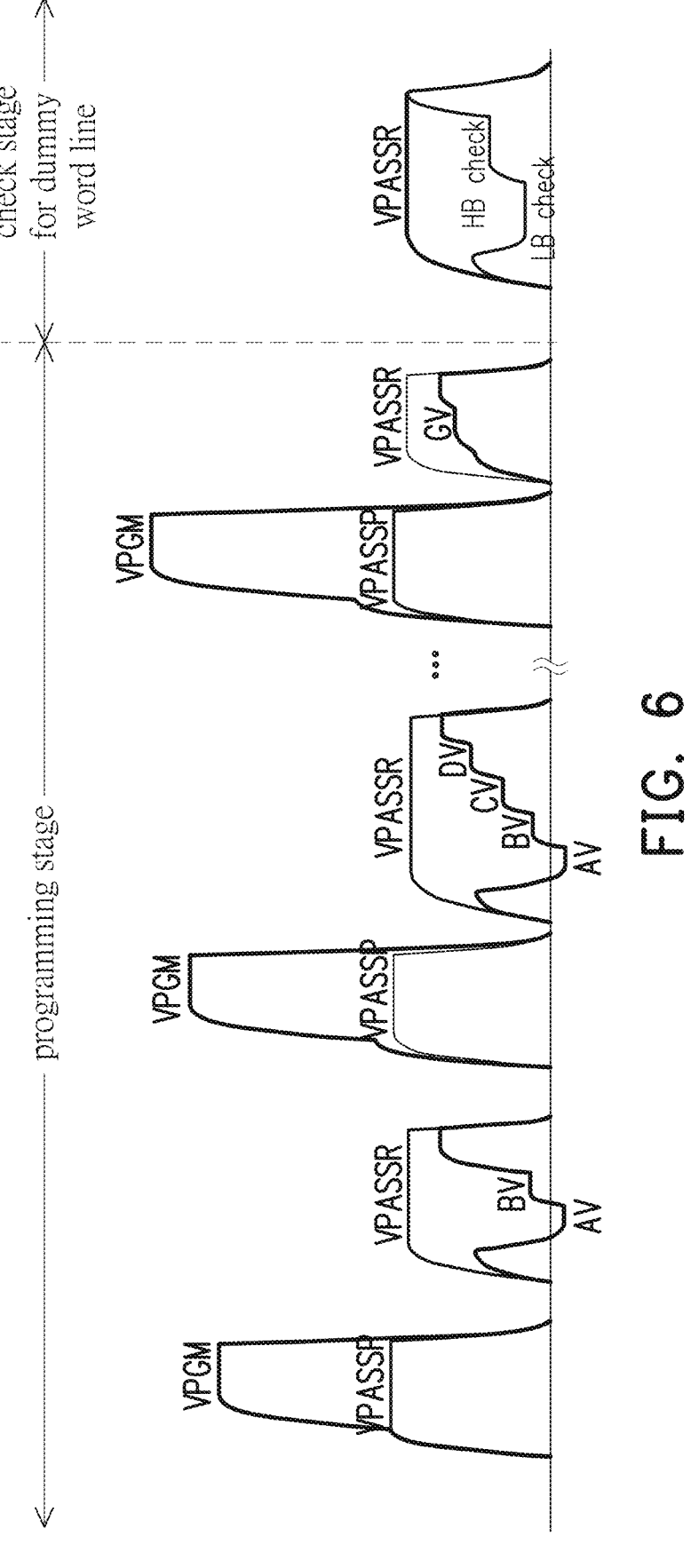
FIG. 6 is a schematic diagram of the voltage waveform of memory programming according to one embodiment of the disclosure.

FIG. 6 illustrates the waveform of the program voltage VPGM for the selected word line during the programming stage, and the waveform of the pass voltage VPASSP applied to the unselected word lines. In addition, the voltage VPASSR during the program verification phase is applied to the unselected word lines, and various state verification voltages AV, BV, . . . , GV are applied to the selected word lines. The voltage waveforms illustrated here are merely examples, and are not intended to limit the waveforms of the program voltage and verification voltages of the disclosure.

In step S104, after the selected word line passes the program verification of step S102, at least one of a high bound check (HB check) and a low bound check (LB check) is performed on a distribution of the threshold voltage VT of at least one dummy word line of the dummy word line set (i.e., determining whether disturbance exists). The high bound value and the low bound value may be preset according to requirements. In addition, although the example takes a bottom dummy word line set DWLB (such as DWLB0~DWLB2) as an example, the check may also be performed on a top dummy word line set DWLT. In the following example, the bottom dummy word line DWLB0 is used as an example, but the test may be applied to all the dummy word lines of the bottom dummy word line set DWLB.

Figure 1:
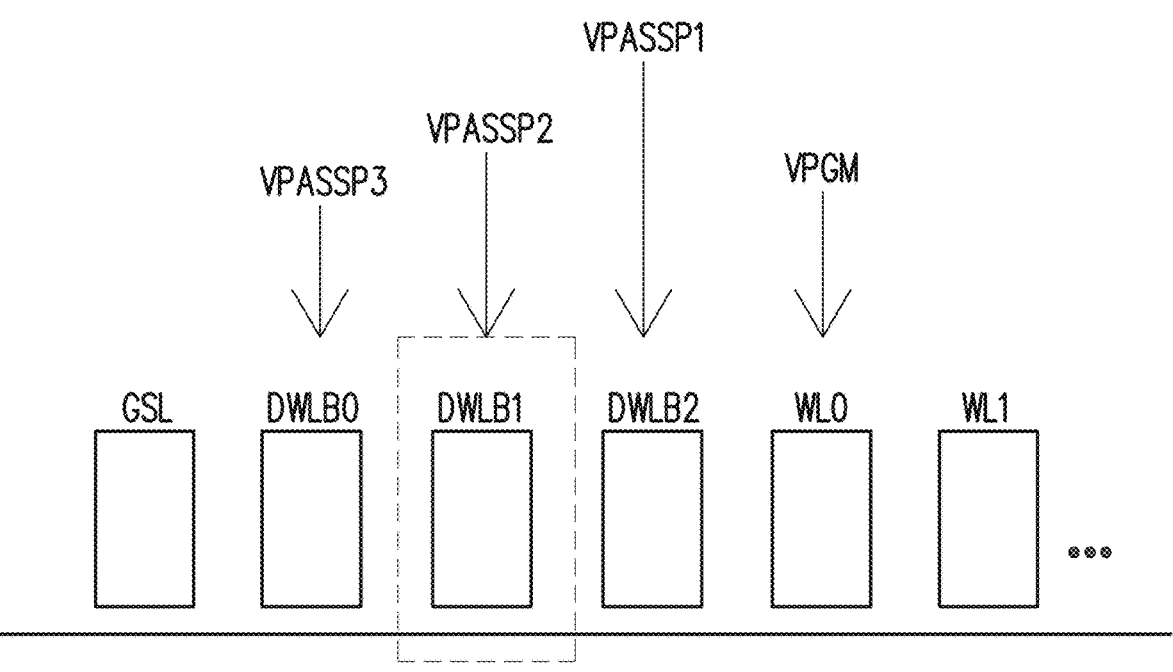
FIG. 1 is a schematic diagram of voltage application during programming in the related art.
Figure 1:
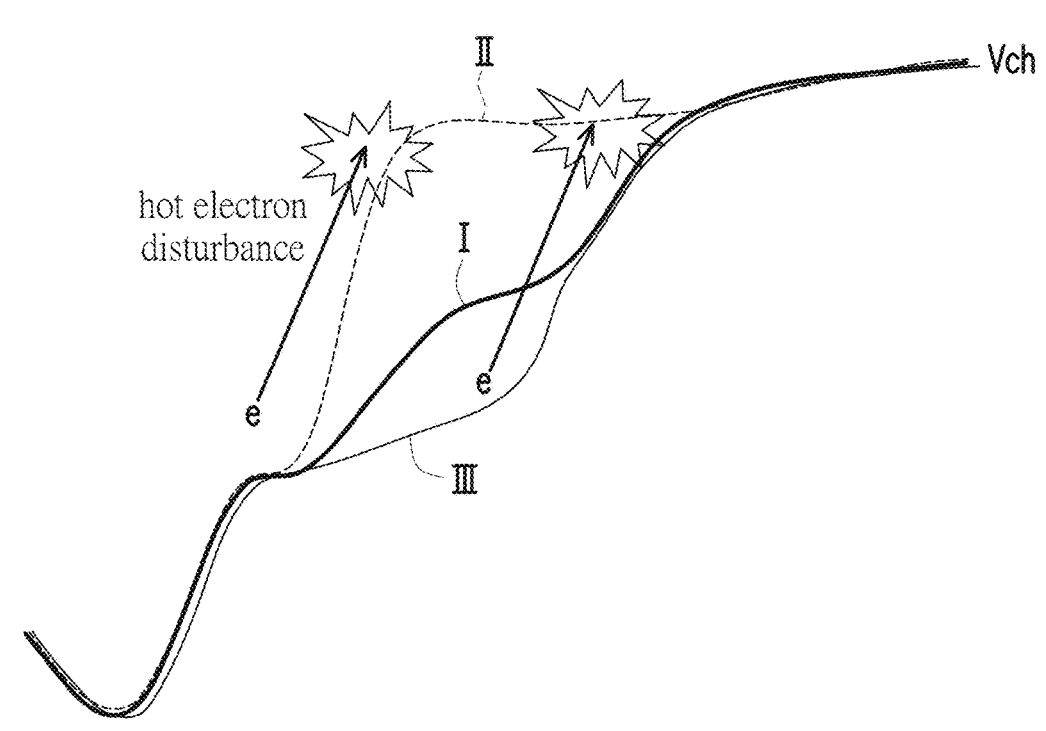
Figures 2A, 2B:
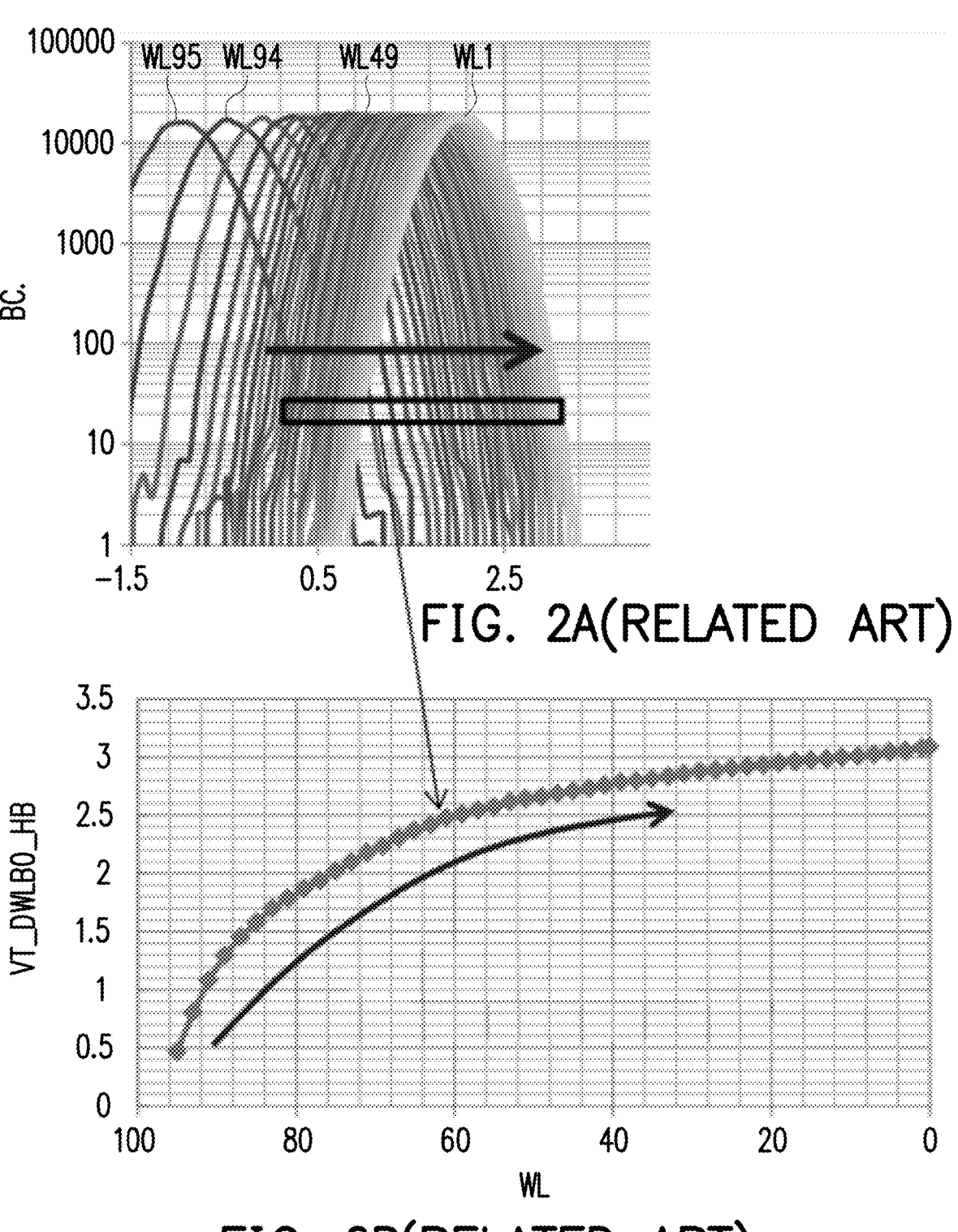
FIG. 2A is a graph showing the relationship between the threshold voltage of the dummy word line and the number of times of programming each word line.
FIG. 2B is a schematic diagram of the threshold voltage of the dummy word line being disturbed.

As described in FIGS. 2A and 2B above, after programming all the word lines, the threshold voltage of the bottom dummy word line DWLB0 is disturbed to a high voltage, thus affecting the accuracy of programming. Therefore, even though the selected word line may pass the program verification after the programming (yes in step S102), if the threshold voltage of the bottom dummy word line DWLB0 is disturbed, the correctness of programming and the data retention may be affected to some extent. Therefore, in the example, the bottom dummy word line DWLB0 is further read to determine whether the distribution of the threshold voltage VT of the bottom dummy word line DWLB0 passes the high bound check (HB check) and/or the low bound check (LB check).

Figure 7:
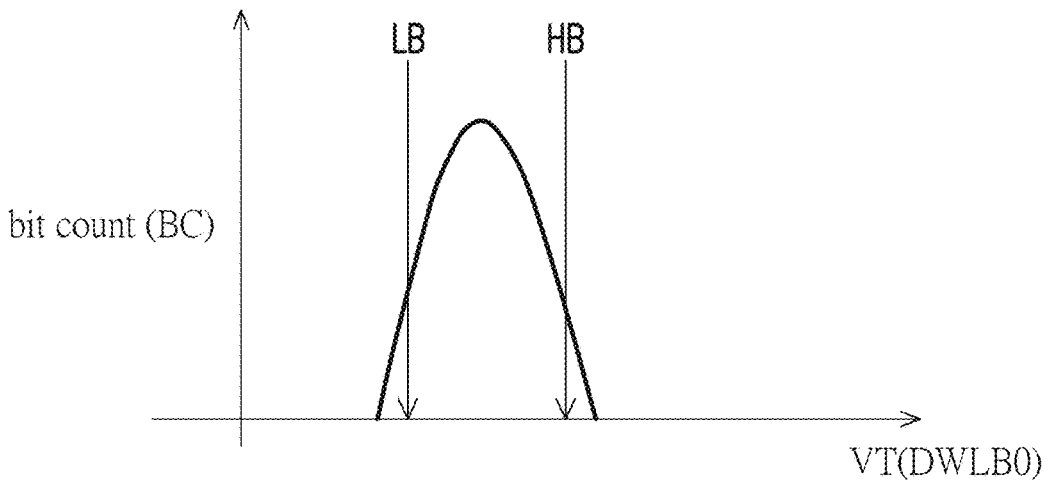
FIG. 7 is a conceptual schematic diagram illustrating the high bound/low bounds of the threshold voltage distribution of the dummy word line according to one embodiment of the disclosure.

As shown in FIG. 7, the vertical axis represents a bit count (BC), and the horizontal axis represents the threshold voltage VT. First, a high bound value HB and a low bound value LB may be preset for checking distribution of the threshold voltage VT of the bottom dummy word line (such as DWLB0). Thus, the HB check and the LB check may be performed by reading the threshold voltage value VT of memory cells on the bottom dummy word line DWLB0, which may further determine whether the programming of the selected word line fails. These will be further described in details as follows. In addition, as shown in FIG. 6, when checking the dummy word line, for example, a read voltage is applied to the bottom word line DWLB0 to perform the high bound (HB) check and the low bound (LB) check. When checking the dummy word line, a pass voltage VPASSR is applied to all word lines (e.g., WL0~WL95). In one example, the pass voltage VPASSR during checking the dummy word line can be the same as the voltage VPASSR during the program verification phase applied to the unselected word lines. In another example, the pass voltage VPASSR during checking the dummy word line can be different from the voltage VPASSR during the program verification phase applied to the unselected word lines.

Figure 8:
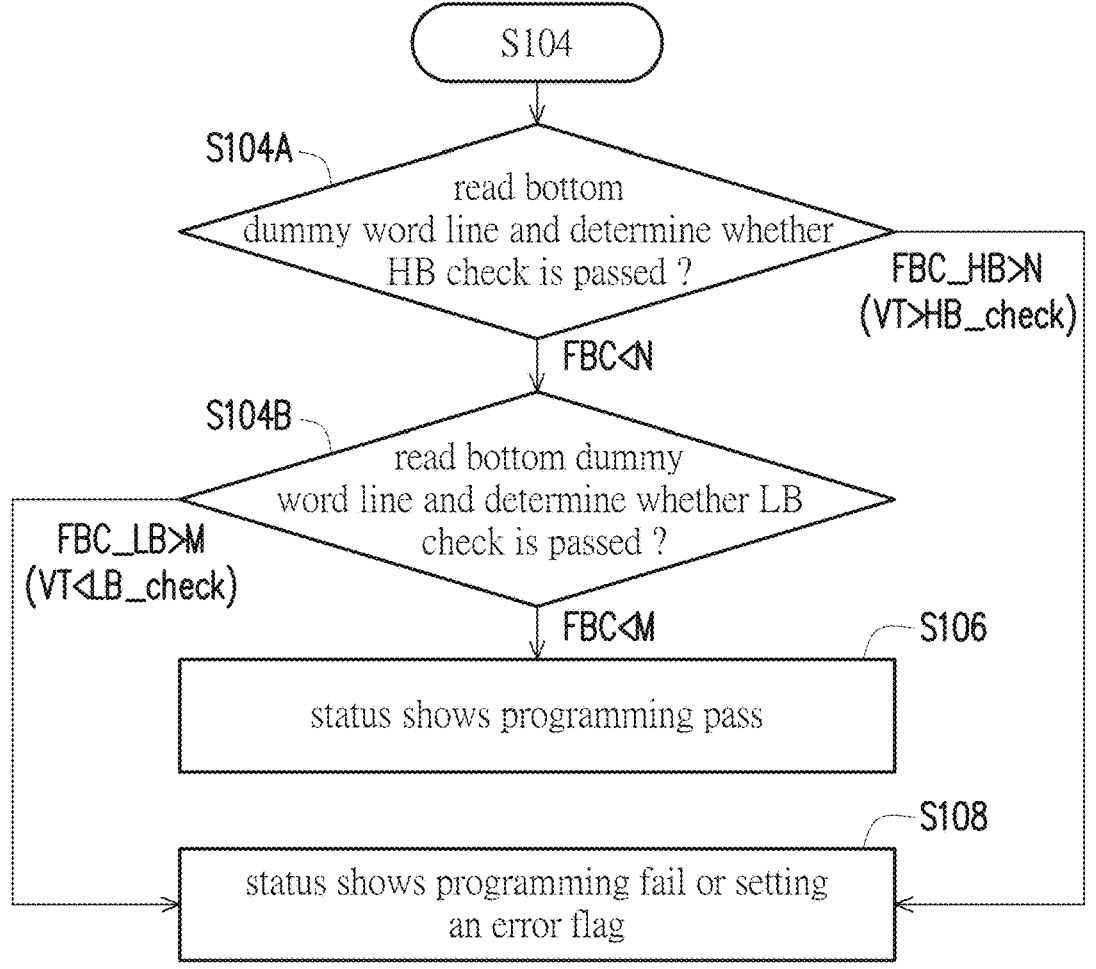
FIG. 8 is a schematic diagram of the process for checking whether the threshold voltage distribution of the dummy word line shown passes the high bound/low bound checks according to one embodiment of the disclosure.

FIG. 8 is a schematic diagram of the process for checking whether the threshold voltage distribution of the dummy word line passes the high bound/low bound checks. As shown in FIG. 8, step S104 of FIG. 5 further includes step S104A and step S104B, which are respectively for performing the HB check and the LB check on the aforementioned bottom dummy word line DWLB0.

Figures 9, 10A:
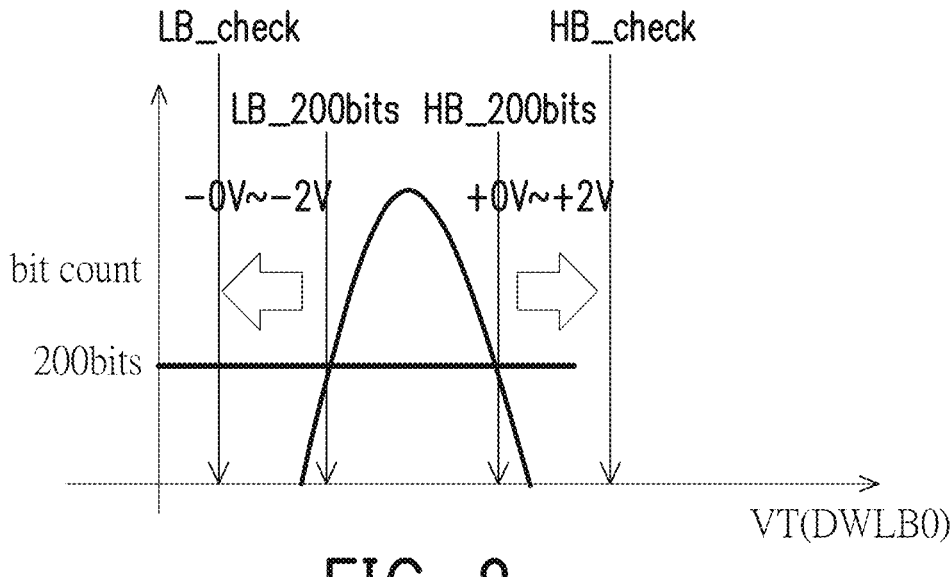
FIG. 9 is a threshold voltage distribution diagram of the high bound/low bound checks of the dummy word line according to one embodiment of the disclosure.
FIG. 10A is a schematic diagram illustrating an example of revising operation settings according to one embodiment of the disclosure.

In addition, FIG. 9 shows the check conditions for the HB check and the LB check of the bottom dummy word line DWLB0 according to the disclosure. As shown in FIG. 9, an example of the HB check condition is to check the high bound of the bottom dummy word line DWLB0, such as setting a high bound value HB_check, and using 200 bits as the determination value of a failure bit count (FBC). Furthermore, the threshold voltage range is set to 0~2V. In addition, an example of the low bound check condition is to check the low bound of the bottom dummy word line DWLB0, such as setting a low bound value LB_check, and using 200 bits as the determination value of the failure bit count (FBC). Furthermore, the threshold voltage range is set to 0~−2V.

As shown in FIGS. 8 and 9, in step S104A, the bottom dummy word line DWLB0 is read to determine whether the bottom dummy word line DWLB0 passes the HB check. That is, when the threshold voltage VT (the first threshold voltage) of the dummy word line DWLB0 is higher than the preset high bound value HB_check, the failure bit count FBC is counted, and whether the high bound failure bit count FBC_HB is greater than a first specified value N is determined. When the high bound failure bit count FBC_HB is greater than the first preset value N, it indicates that the programming of the selected word line fails. At this time, step S108 is executed, and the status of the selected word line is shown as a program fail or an error flag is set. On the contrary, when the high bound failure bit count FBC_HB is less than the first preset value N, step S104B is performed.

In step S104B, the bottom dummy word line DWLB0 is read to determine whether the bottom dummy word line DWLB0 passes the LB check. That is, when the threshold voltage VT (the second threshold voltage) of the dummy word line DWLB0 is lower than the preset low bound value LB, the failure bit count FBC is counted, and whether the low bound failure bit count FBC_LB is greater than a second preset value M is determined. When the low bound failure bit count FBC_LB is greater than the second preset value M, it indicates that the programming of the selected word line fails. At this time, step S108 is executed, the status of the selected word line is shown as a program fail or an error flag is set. On the contrary, when the low bound failure bit count FBC_LB is less than the second preset value M, step S106 is performed, and the status of the selected word line is shown as pass for the programming operation. Then, the programming operation is completed.

It should be noted that it is not necessary to perform both of the above step S104A (HB check) and step S104B (LB check). That is, both of the HB check and the LB check may be performed or only one of the HB check and the LB check may be performed. Taking FIG. 8 as an example, in the case where only the HB check of step S104A is performed, whether to proceed to step S106 or step S108 may be determined according to whether the high bound failure bit count FBC_HB is greater than the first specified value N.

In addition, in the case where both of the HB check in step S104A and the LB check in step S104B are performed, the order of step S104A and step S104B may be changed, and is not particularly limited by the embodiment of the disclosure.

Therefore, in step S104, when at least one bottom dummy word line of the bottom dummy word line set DWLB fails in at least one of the HB check and the LB check, step S108 is performed. In step S108, the status of the selected word line is shown as a program fail, or an error flag is set. As a result, a user may know which word line has problems and needs attention, and thus avoid using such word line or revising operation settings.

Regarding the program fail, when the bottom dummy word line DWLB0 fails in the HB check or the LB check (especially, when it is determined in step S108 that the word line can hardly be programmed correctly), the controller may set some word lines subjected to be disturbed as bad blocks or as dummy word lines (different from the aforementioned bottom or top dummy word lines), thereby avoiding the use of the disturbed word lines when operating the memory device.

Regarding setting the error flag, the controller may perform some corresponding operations, such as revising operation settings. That is, the operation settings are revised if it is determined in step S108 that the situation where the word line cannot be correctly programmed is not so severe, that is, if the word line has some problems but is still usable. As an example, a new read level may be set to determine the programming risk. FIG. 10A shows a threshold voltage distribution diagram after programming. When there is no severe programming disturbance (i.e., erase state threshold voltage distribution does not shift to right side), the erase state ER and the program state A can be distinguished and read by the read level RDA. However, when it is determined by at least one of the HB check and the LB check that the threshold voltage distribution occurs (for example, the erase state ER is disturbed to be shifted to the right side (indicated by bold line, i.e., the disturbed erase state ER')), the program state A may be improperly read as the disturbed erase state ER' by the read level RDA. At the time, when it is determined that the word lines may still be used, then a new read level RDA' (shifted to the right side (upshifted) from the read level RDA in this example) may be set to change the operation settings.

Figure 10B:
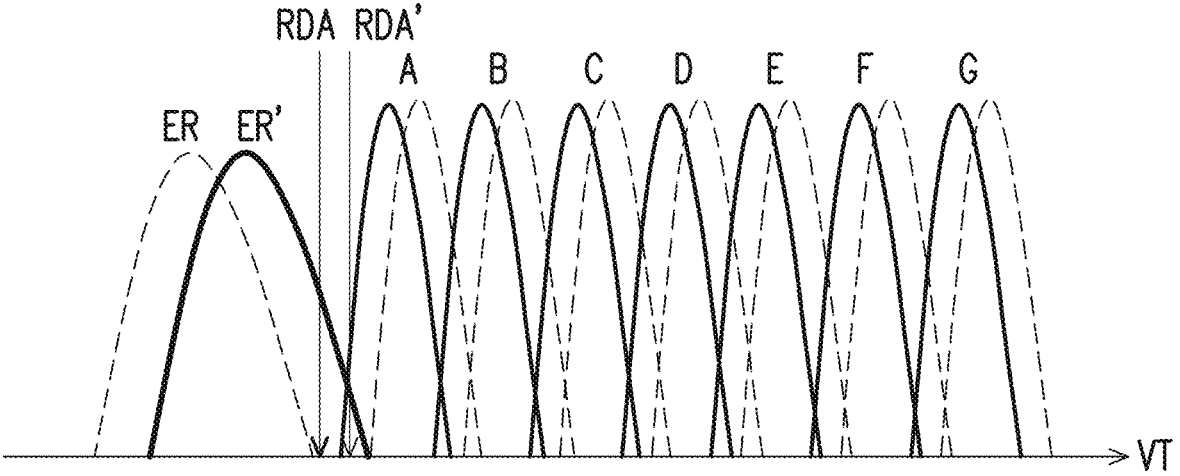
FIG. 10B is a schematic diagram illustrating another example of revising operation settings according to one embodiment of the disclosure.

FIG. 10B illustrates another example of revising operation settings according to one embodiment of the disclosure. As mentioned above, the erase state ER may be disturbed to be shifted to the right side (upshifted) as shown in FIG. 10A or FIG. 10B. Then, even if the read level RDA is set to the new read level RDA', the program state A may still be too close to the disturbed erase state ER', and thus more failure bits will be counted. Therefore, as another example of revising operation settings, the program states A~G (as well as the corresponding read states A~G) may be further shifted to the right side (upshifted) as shown in FIG. 10B. Namely, the solid-line program states A~G are shifted to the dash-line program states A~G. In this manner, all the states are shifted, and the shifted program state A is further separated from the disturbed erase state ER'. As a result, the failure bit count can be reduced during the reading operation.

On the other hand, in step S104, when at least one of the bottom dummy word lines (one of DWLB0~DWLB2) in the bottom dummy word line set DWLB passes at least one of the aforementioned HB check and LB check, step S106 is executed, and the status of the selected word line of the memory device is shown as pass for the programming operation. Then, the programming operation of the selected word line is completed, and the programming for the next word line is performed.

Figure 11:
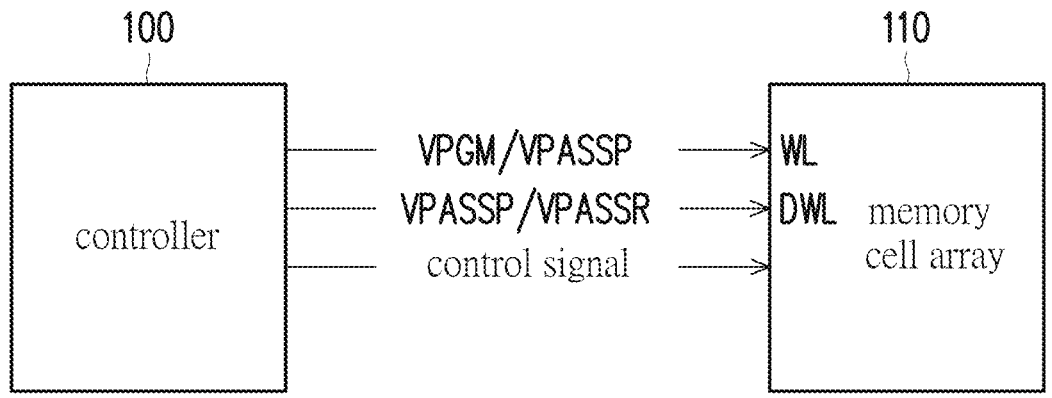
FIG. 11 is a schematic diagram of a memory device according to one embodiment of the disclosure.

FIG. 11 is a schematic diagram of the control circuit block of the memory device according to an embodiment of the disclosure. FIG. 11 shows a simplified schematic diagram. Those skilled in the art may design the actual circuit architecture and various functional blocks, such as row decoders, column decoders, voltage generation circuits, various buffers, control logic, and I/O circuits, appropriately based on the concepts of the disclosure according to their needs.

As shown in FIG. 11, the memory device includes, but is not limited to, a controller 100 and a memory cell array 110. The memory cell array 110 includes a plurality of memory cells arranged as an array. The memory cell array 110 further includes a dummy word line set, a plurality of word lines WL (such as WLO~WL95), the common source line CSL, and the bit line BL (as shown in FIG. 3). In addition, although FIG. 11 merely illustrates the bottom dummy word line set DWLB, the top dummy word lines (such as DWL-TO~DWLT2) as shown in FIG. 3 may also be included. Furthermore, by applying biases to the word lines WL, the common source line CSL and the bit line BL, operations such as reading, programming, or erasing may be performed on each of the word lines WL of the memory device. Here, the memory cell array 110 is not particularly limited. As an example, the memory cell array 110 may be arranged as a 3D or 2D NAND flash memory cell array."

The controller 100 is basically configured to control all operations of the memory cell array 110, including reading, programming, erasing, etc. The programming method is described here, and the reading and erasing operations can be realized by any existing methods, which are omitted.

In addition, the controller 100 may be configured to perform the programming control process illustrated in FIGS. 5 and 8 for the word lines WL and the bottom dummy word line set DWLB (which may also include the top dummy word line set DWLT) of the memory cell array 110, for example, by transmitting control signals to the memory cell array 110. Furthermore, the controller 100 may be configured to perform the setting process of step S108 (showing a program fail or setting an error flag, as described above) for each of the word lines WL of the memory cell array 110 based on results of the HB check and/or LB check for the dummy word lines, and may also be configured to perform the setting process of step S106 (showing pass for the programming operation, as described above).

The above embodiment is described based on the 3D NAND flash memory as an example, but the disclosure is not limited to NAND-type flash memory, and the programming method of the disclosure may also be applied to other types of memory. In addition to 3D NAND flash memory, the programming method of the disclosure can also be applied to 2D flash memory.

In addition, the programming method of the disclosure is not only adapted for memory with 2D or 3D structures, but also adapted for structures in which a memory cell is a single-level cell (SLC) that stores 1 bit, a dual-level cell that stores 2 bits, a triple-level cell (TLC) that stores 3 bits, or a quad-level cell (QLC) that stores 4 bits, or a multiple-level cell (MLC).

In summary, in the disclosure, after the word lines are programmed and pass the program verification, the high bound check and/or the low bound check is further performed for the threshold voltage distribution of at least one of the bottom dummy word lines to determine whether disturbance exits. The programming result of the selected word line is shown as a pass only when the distribution of the threshold voltage of the bottom dummy (or top) word line passes the HB check and/or the LB check. Thus, the effectiveness and data retention of programming may be further ensured, thereby improving the reliability of programming.

What is claimed is:

1. A programming method for a memory device, wherein the memory device comprises a memory cell array having a plurality of word lines and a dummy word line set, the programming method comprising:
    selecting a word line from the plurality of word lines, applying a program voltage to the selected word line for programming, and applying a pass voltage to word lines other than the selected word line in the plurality of word lines and the dummy word line set;
    performing program verification on the selected word line that has been programmed;
    in response to the selected word line passing the program verification, performing at least one of a high bound check and a low bound check on a threshold voltage distribution of at least one dummy word line of the dummy word line set; and
    in response to the at least one dummy word line of the dummy word line set failing in at least one of the high bound check and the low bound check, showing a status of the selected word line as a program fail, or setting an error flag.

2. The programming method for the memory device according to claim 1, wherein the high bound check further comprises:
    reading a first threshold voltage of the at least one dummy word line of the dummy word line set;
    in response to the first threshold voltage being higher than a preset high bound value, determining whether a high bound failure bit count is greater than a first preset value; and
    in response to the high bound failure bit count being greater than the first preset value, showing the status of the selected word line as the program fail or setting the error flag.

3. The programming method for the memory device according to claim 2, wherein the low bound check further comprises:
    reading a second threshold voltage of the at least one dummy word line of the dummy word line set;
    in response to the second threshold voltage being lower than a preset low bound value, determining whether a low bound failure bit count is greater than a second preset value; and
    in response to the low bound failure bit count being greater than the second preset value, showing the status of the selected word line as the program fail or setting the error flag.

4. The programming method for the memory device according to claim 3, wherein the first preset value is the same as the second preset value.

5. The programming method for the memory device according to claim 1, wherein the low bound check further comprises:
    reading a second threshold voltage of the at least one dummy word line of the dummy word line set;
    in response to the second threshold voltage being lower than a preset low bound value, determining whether a low bound failure bit count is greater than a second preset value; and
    in response to the low bound failure bit count being greater than the second preset value, showing the status of the selected word line as the program fail or setting the error flag.

6. The programming method for the memory device according to claim 1, wherein the program fail comprises marking the selected word line as a dummy word line or marking a selected block as a bad block.

7. The programming method for the memory device according to claim 1, wherein the error flag comprises setting a flag for the selected word line to revise operation settings.

8. The programming method for the memory device according to claim 1, further comprising:
    showing a status of programming pass and terminating programming of the memory device in response to the at least one dummy word line of the dummy word line set being determined as passing at least one of the high bound check and the low bound check.

9. The programming method for the memory device according to claim 1, wherein the memory device is three-dimensional (3D) NAND flash memory or two-dimensional (2D) NAND flash memory.

10. The programming method for the memory device according to claim 1, wherein a memory cell of the memory cell array is a single-level cell, a triple-level cell, a quad-level cell or a multiple-level cell.

11. A memory device, comprising:

a memory cell array, comprising a plurality of word lines and a dummy word line set; and a controller, configured to control the memory cell array, wherein the controller performs programming on each of the plurality of word lines, and the programming comprises:

selecting a word line from the plurality of word lines, applying a program voltage to the selected word line for the programming, and applying a pass voltage to word lines other than the selected word line in the plurality of word lines and the dummy word line set;

performing program verification on the selected word line that has been programmed;

in response to the selected word line passing the program verification, performing at least one of a high bound check and a low bound check on a threshold voltage distribution of at least one dummy word line of the dummy word line set; and in response to the at least one dummy word line of the dummy word line set failing in at least one of the high bound check and the low bound check, showing a status of the selected word line as a program fail, or setting an error flag.

12. The memory device according to claim 11, wherein the high bound check further comprises:

reading a first threshold voltage of the at least one dummy word line of the dummy word line set;

in response to the first threshold voltage being higher than a preset high bound value, determining whether a high bound failure bit count is greater than a first preset value; and in response to the high bound failure bit count being greater than the first preset value, showing the status of the selected word line as the program fail or setting the error flag.

13. The memory device according to claim 12, wherein the low bound check further comprises:

reading a second threshold voltage of the at least one dummy word line of the dummy word line set;

in response to the second threshold voltage being lower than a preset low bound value, determining whether a low bound failure bit count is greater than a second preset value; and in response to the low bound failure bit count being greater than the second preset value, showing the status of the selected word line as the program fail or setting the error flag.

14. The memory device according to claim 13, wherein the first preset value is the same as the second preset value.

15. The memory device according to claim 11, wherein the low bound check further comprises:

reading a second threshold voltage of the at least one dummy word line of the dummy word line set;

in response to the second threshold voltage being lower than a preset low bound value, determining whether a low bound failure bit count is greater than a second preset value; and in response to the low bound failure bit count being greater than the second preset value, showing the status of the selected word line as the program fail or setting the error flag.

16. The memory device according to claim 11, wherein the program fail comprises marking the selected word line as a dummy word line or marking a selected block as a bad block.

17. The memory device according to claim 11, wherein the error flag comprises setting a flag for the selected word line to revise operation settings.

18. The memory device according to claim 11, wherein the controller further performs:

showing a status of programming pass and terminating programming of the memory device in response to the at least one dummy word line of the dummy word line set being determined as passing at least one of the high bound check and the low bound check.

19. The memory device according to claim 11, wherein the memory device is 3D NAND flash memory or 2D NAND flash memory.

20. The memory device according to claim 11, wherein a memory cell of the memory cell array is a single-level cell, a triple-level cell, a quad-level cell or a multiple-level cell.

* * * * *